US007056754B2

(12) United States Patent
Wong

(10) Patent No.: US 7,056,754 B2
(45) Date of Patent: Jun. 6, 2006

(54) METHODS FOR PRODUCING WAVEGUIDES

(75) Inventor: Marvin Glenn Wong, Woodland Park, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 11/133,888

(22) Filed: May 20, 2005

(65) Prior Publication Data

US 2005/0220433 A1 Oct. 6, 2005

Related U.S. Application Data

(62) Division of application No. 10/619,920, filed on Jul. 15, 2003, now Pat. No. 6,915,054.

(51) Int. Cl.
*H01L 21/4763* (2006.01)

(52) U.S. Cl. ........................ 438/31; 438/619; 438/780; 438/781

(58) Field of Classification Search ................ 438/619, 438/31, 780, 781
See application file for complete search history.

(56) References Cited

U.S. PATENT DOCUMENTS

| | | | |
|---|---|---|---|
| 3,801,388 | A | 4/1974 | Akiyama et al. |
| 4,404,059 | A | 9/1983 | Livshits et al. |
| 5,641,709 | A | 6/1997 | Lee |
| 5,677,574 | A | 10/1997 | Hisaka |
| 5,986,893 | A | 11/1999 | Leigh et al. |
| 6,013,573 | A | 1/2000 | Yagi |
| 6,071,805 | A | 6/2000 | Liu |
| 6,075,278 | A | 6/2000 | Farrar |
| 6,165,890 | A | 12/2000 | Kohl et al. |
| 6,248,247 | B1 | 6/2001 | Goenka et al. |
| 6,433,431 | B1 | 8/2002 | Farrar |
| 6,498,070 | B1 | 12/2002 | Chang et al. |
| 6,604,967 | B1 | 8/2003 | Middlehurst et al. |
| 6,693,355 | B1 | 2/2004 | Grove |
| 6,788,867 | B1 | 9/2004 | Mule' et al. |

*Primary Examiner*—Cathy F. Lam

(57) ABSTRACT

Methods for producing waveguides are disclosed. In one embodiment, a waveguide is produced by depositing a first metal layer on a substrate, depositing a sacrificial material on the first metal layer, depositing a second metal layer on the sacrificial material, the second metal layer contacting the first metal layer and defining therebetween a cavity for the waveguide, the cavity filled with the sacrificial material, and removing the sacrificial material.

14 Claims, 3 Drawing Sheets

METHODS FOR PRODUCING WAVEGUIDES

CROSS-REFERENCE TO RELATED APPLICATION

This is a divisional of application Ser. No. 10/619,920 filed on Jul. 15, 2003, now U.S. Pat. No. 6,915,054, the entire disclosure of which is incorporated into this application by reference.

BACKGROUND

Waveguides are used in various applications to conduct high frequency signals. The waveguides may be manufactured by machining cavities or passages in metal blocks, plating them, and attaching lids to cover the cavities and passages. This process to produce waveguides may be overly expensive.

SUMMARY OF THE INVENTION

Methods for producing waveguides are disclosed. In one embodiment, a waveguide is produced by depositing a first metal layer on a substrate. Next, a sacrificial material is deposited on the first metal layer. A second metal layer is then deposited on the sacrificial material so that it contacts the first metal layer and defines therebetween a cavity for the waveguide, the cavity filled with the sacrificial material. Finally, the sacrificial material is removed.

BRIEF DESCRIPTION OF THE DRAWINGS

Illustrative embodiments of the invention are illustrated in the drawings, in which.

DETAILED DESCRIPTION

Figure 1:
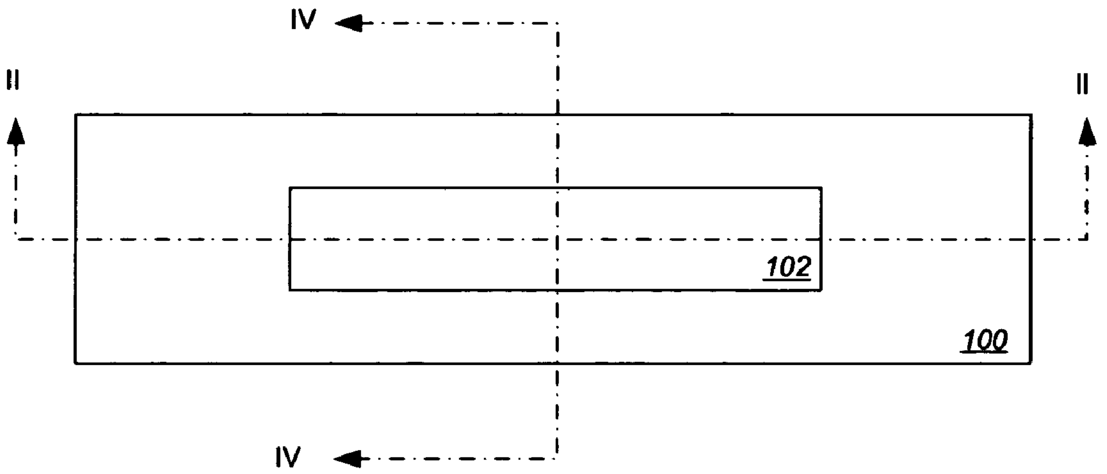
FIG. 1 illustrates an exemplary plan view of a waveguide before a sacrificial material has been removed.
Figure 2:
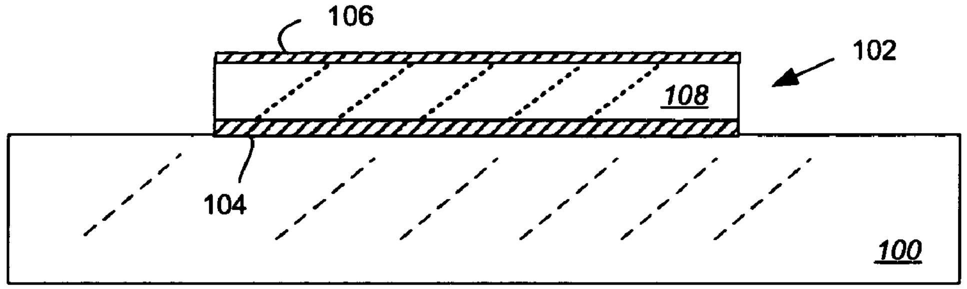
FIG. 2 illustrates a first sectional of the waveguide shown in FIG. 1.
Figure 3:
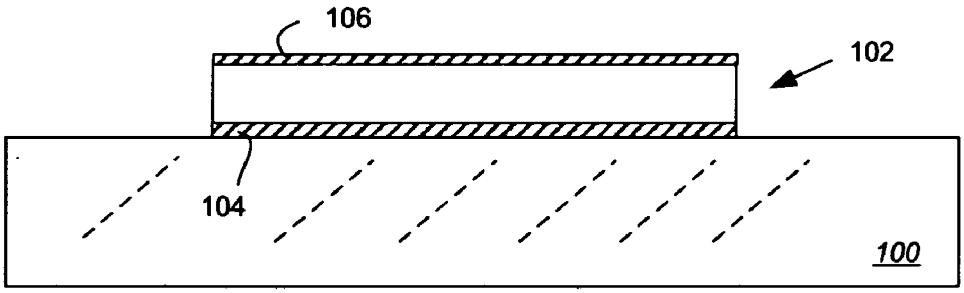
FIG. 3 illustrates the waveguide shown in FIGS. 1 and 2 after the sacrificial material has been removed.
Figure 4:
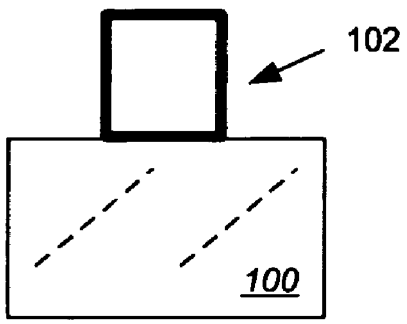
FIG. 4 illustrates a sectional of the waveguide shown in FIG. 1–3 after the sacrificial material has been removed.
Figure 5:
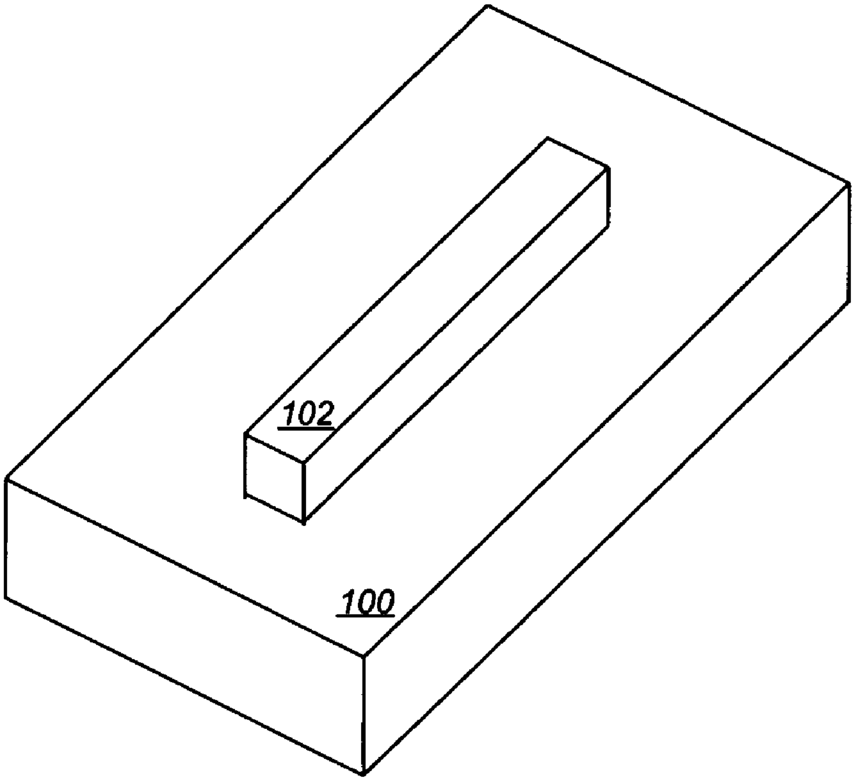
FIG. 5 illustrates a perspective view of the waveguide shown in FIGS. 1–4 after the sacrificial material has been removed.
Figure 6:
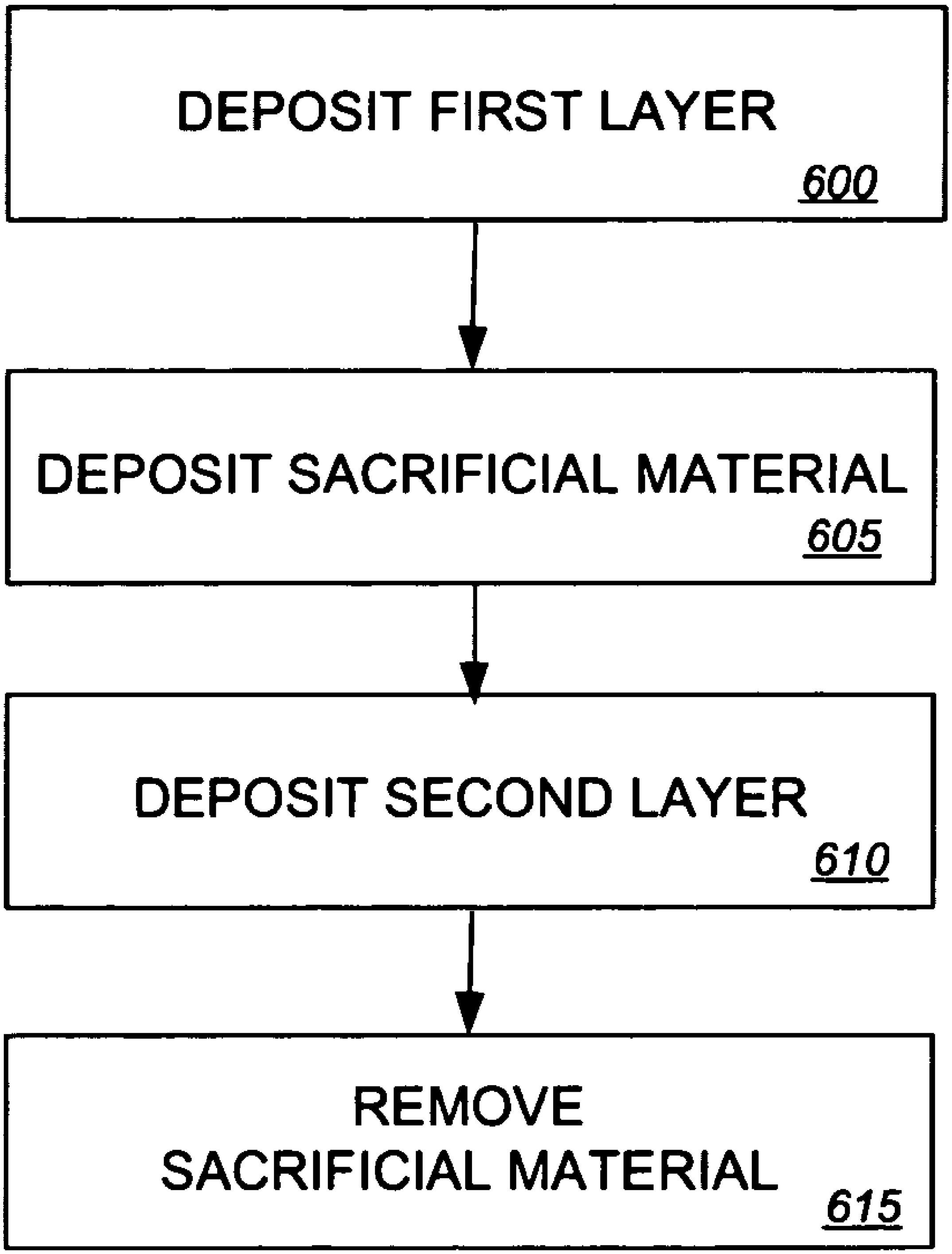
FIG. 6 illustrates an exemplary method that may be used to produce the waveguide of FIGS. 1–5.

An exemplary embodiment of a waveguide that may be used to conduct high frequency electrical signals is illustrated in FIGS. 1–5. As illustrated in FIG. 6, the waveguide 102 may be produced by first depositing 600 a first metal layer 104 on a substrate 100. By way of example, the first metal layer may be gold and may be deposited by sputtering, evaporation, or lamination. Other methods may also be used to deposit the first metal layer 104 on the substrate 100. In some embodiments, after the first metal layer is deposited 600, it may then be plated to increase the thickness.

Next, a sacrificial material 108 is deposited 605 on the first metal layer 104. Sacrificial material 108 may be deposited by spin coating, spray coating, curtain coating, or other suitable method. The thickness of the sacrificial material 108 may vary depending upon the desired height of the waveguide 102. As will be described in further detail below, sacrificial material 108 will be removed after the waveguide structure is formed to produce a waveguide 102 that may be used to conduct high frequency electrical signals.

In one embodiment, after sacrificial material 108 has been deposited 605, sacrificial material 108 may be patterned to a desired length and width for the waveguide 102. By way of example, the desired length of the waveguide may be 0.70 times the wavelength (e.g., 2.1 cm for a wavelength of 3 cm) and the desired height of the waveguide may be 0.30 times the wavelength (e.g., 0.9 cm for a wavelength of 3 cm). Other suitable dimensions may also be used.

The patterning may comprise depositing a mask layer (e.g., aluminum or silicon nitride) on the sacrificial material 108. A photoresist material may then be spin-coated and patterned on the mask layer. A portion of the mask layer not layered by the photoresist material may then be etched away and the photoresist material may then be removed. Reactive ion etching or other technique may be used to remove the sacrificial material 108 not layered by the mask layer. The mask layer may then be removed. It should be appreciated that in alternate embodiments, other methods may be used to pattern sacrificial material 108 so that it is the desired length and width of waveguide 102.

In some embodiments, the first metal layer 104 may also be patterned during the patterning of sacrificial material 108. Alternately, first metal layer 104 may be patterned prior to the deposition of sacrificial material 108 or may not be patterned. It should be appreciated that first metal layer 104 may span more than the length and width of waveguide 102.

After the sacrificial material 108 has been deposited 605, a second metal layer 106 (e.g., gold) is then deposited 610 on the sacrificial material 108 so that it contacts the first metal layer 104. The second layer 106 may be deposited by sputtering, evaporation, lamination, or other suitable method. In some embodiments, after the second metal layer 106 is deposited 610, it may then be plated to increase the thickness. The second metal layer 106 in combination with the first metal layer 104 forms a structure for a waveguide 102 with the cavity of the waveguide 102 being filled by sacrificial material 108.

In one embodiment, after the second metal layer 106 has been deposited 610, the second metal layer 106 may be patterned to the desired width and/or length of waveguide 102. The second metal layer 106 may be patterned by depositing and patterning a photoresist material on the second metal layer 106 to the desired length and/or width of waveguide 102. The second metal layer may then be etched. Finally, the photoresist material may be removed. Other methods may also be used to pattern second metal layer 106. It should be appreciated that in other embodiments, the second metal layer 106 may not be patterned and may span more than the length and/or width of waveguide 102.

Finally, after the second metal layer 106 has been deposited 610, the sacrificial material 108 is removed 615. In one embodiment, the sacrificial material 108 comprises a material that decomposes at a lower temperature than the first and second metal layers and the sacrificial material 108 may be removed 615 using thermal decomposition. By way of example, the sacrificial material 108 may be polynorbornene and may be decomposed at 425° Celsius at oxygen concentrations below 5 parts per million (ppm). Other suitable materials and temperatures may be used to thermally decompose sacrificial material 108.

Methods other than thermal decomposition may also be used to remove 615 sacrificial material 108. By way of example, sacrificial material 108 may be removed by etching, dissolving, or other suitable method. It should be appreciated that the removal of sacrificial material 108 produces a waveguide 102 that may be used to conduct high frequency electrical signals, or other signals. This process may be less expensive than other traditional methods of waveguide construction.

While illustrative and presently preferred embodiments of the invention have been described in detail herein, it is to be understood that the inventive concepts may be otherwise variously embodied and employed, and that the appended claims are intended to be construed to include such variations, except as limited by the prior art.

What is claimed is:

1. A method comprising:

depositing a first metal layer on a substrate;

depositing a sacrificial material on the first metal layer;

depositing a second metal layer on the sacrificial material, the second metal layer contacting the first metal layer and defining therebetween a cavity for a waveguide, the cavity filled with the sacrificial material; and removing the sacrificial material to produce a waveguide.

2. The method of claim 1, wherein removing the sacrificial material comprises thermally decomposing the sacrificial material.

3. The method of claim 1, wherein removing the sacrificial material comprises etching the sacrificial material.

4. The method of claim 1, wherein removing the sacrificial material comprises dissolving the sacrificial material.

5. The waveguide of claim 1, further comprising before depositing the sacrificial material, plating the first metal layer.

6. The method of claim 1, further comprising before depositing the second metal layer, patterning the sacrificial material by:

depositing a mask layer on the sacrificial material;

depositing photoresist material on the mask layer;

etching at least a portion of the mask layer;

removing the photoresist material;

reactive ion etching the sacrificial material not layered by the mask layer; and removing the mask layer.

7. The method of claim 6, wherein depositing photoresist material comprises spin coating the photoresist material, and patterning the photoresist material to a desired length and width of the waveguide.

8. The method of claim 1, further comprising after depositing the second metal layer, patterning the second metal layer to a desired length and width of the waveguide.

9. The method of claim 8, wherein patterning comprises:

depositing a photoresist material on the second metal layer;

patterning the photoresist material to the desired length and width of the waveguide;

etching the second metal layer; and removing the photoresist material.

10. The method of claim 1, wherein the sacrificial material comprises polynorbornene.

11. The method of claim 1, wherein the first and second layers comprise gold.

12. The method of claim 1, wherein depositing a first metal layer comprises sputtering the first metal layer.

13. The method of claim 1, wherein depositing a first metal layer comprises laminating the first metal layer.

14. The method of claim 1, wherein depositing a sacrificial material comprises spin coating the sacrificial material.

* * * * *